United States Patent
Andreev et al.

(10) Patent No.: US 7,313,660 B2
(45) Date of Patent: Dec. 25, 2007

(54) DATA STREAM FREQUENCY REDUCTION AND/OR PHASE SHIFT

(75) Inventors: Alexander E. Andreev, San Jose, CA (US); Igor A. Vikhliantsev, Sunnyvale, CA (US); Vojislav Vukovic, Santa Clara, CA (US)

(73) Assignee: LSI Corporation, Milpitas, CA (US)

( * ) Notice: Subject to any disclaimer, the term of this patent is extended or adjusted under 35 U.S.C. 154(b) by 866 days.

(21) Appl. No.: 10/656,195

(22) Filed: Sep. 4, 2003

(65) Prior Publication Data

US 2005/0053182 A1    Mar. 10, 2005

(51) Int. Cl.
*G06F 12/00* (2006.01)
(52) U.S. Cl. ............... 711/159; 712/300; 710/305; 713/400; 341/100; 341/61; 436/94
(58) Field of Classification Search ............... 711/159; 710/305; 713/400; 341/100, 61; 436/94
See application file for complete search history.

(56) References Cited

U.S. PATENT DOCUMENTS

| | | | | |
|---|---|---|---|---|
| 4,901,076 A | * | 2/1990 | Askin et al. ............ | 341/100 |
| 5,128,940 A | * | 7/1992 | Wakimoto ............ | 370/544 |
| 5,864,309 A | * | 1/1999 | Hung ............ | 341/61 |
| 6,228,656 B1 | * | 5/2001 | Ishiguro et al. ............ | 436/94 |
| 6,696,995 B1 | * | 2/2004 | Foley et al. ............ | 341/100 |
| 6,996,650 B2 | * | 2/2006 | Calvignac et al. ............ | 710/305 |
| 7,065,665 B2 | * | 6/2006 | Jacobson et al. ............ | 713/400 |
| 2004/0015666 A1 | * | 1/2004 | Rojas et al. ............ | 711/159 |

\* cited by examiner

*Primary Examiner*—Chieh M. Fan
*Assistant Examiner*—Sudhanshu C. Pathak
(74) *Attorney, Agent, or Firm*—Westman, Champlin & Kelly

(57) ABSTRACT

A frequency reduction or phase shifting circuit has an input receiving an input data stream having an input frequency and a representation of desired output frequency. A splitter splits the input data stream into a plurality of split signals each at a frequency of the desired output frequency. A plurality of catchers identify valid bits of each respective split signal. A shifter shifts valid bits identified by at least some of the catchers by a predetermined number, which establishes a de-serialization level for frequency reduction or phase shifting. An output provides an output data stream at the desired output frequency.

15 Claims, 5 Drawing Sheets

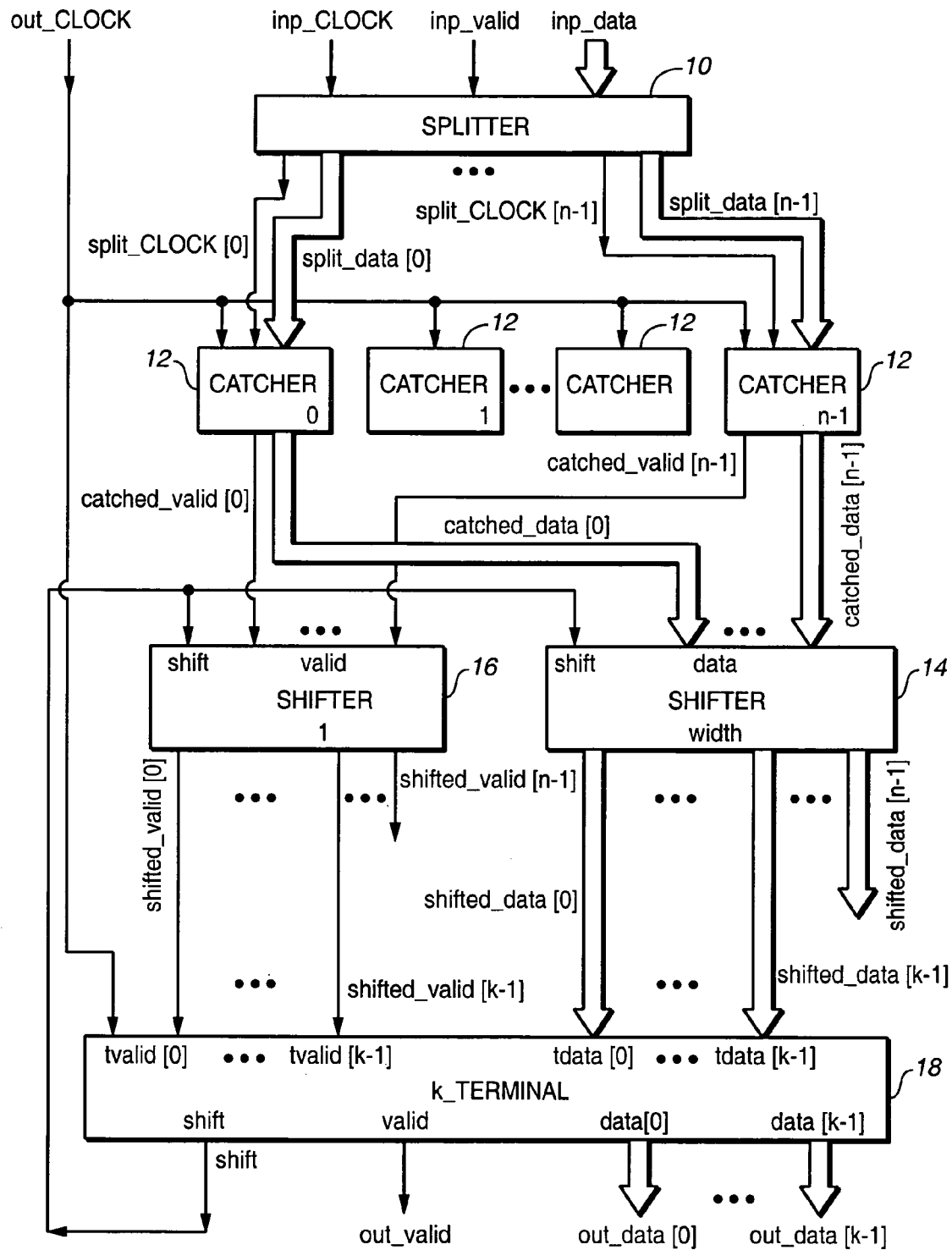
FIG._1

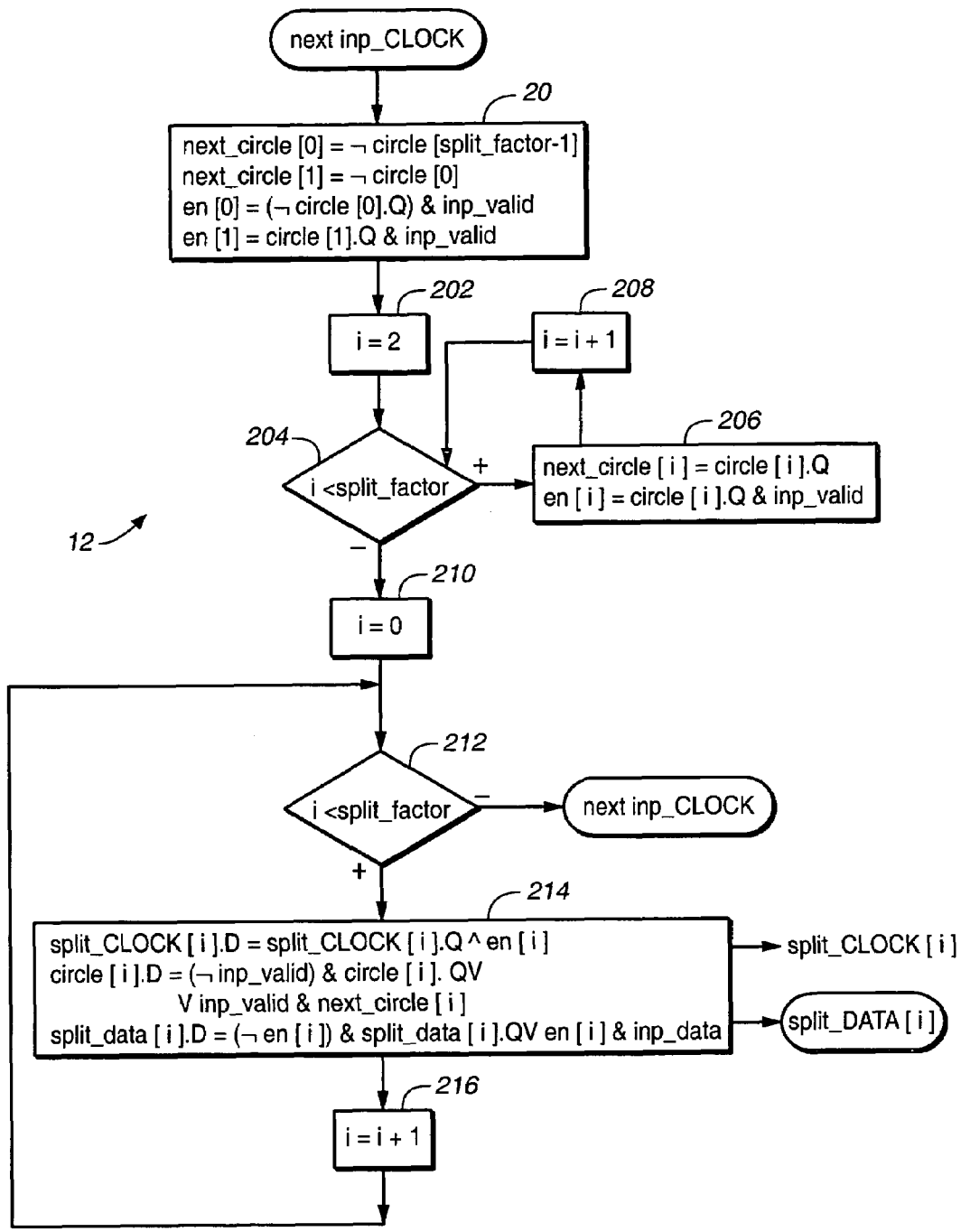
FIG._2

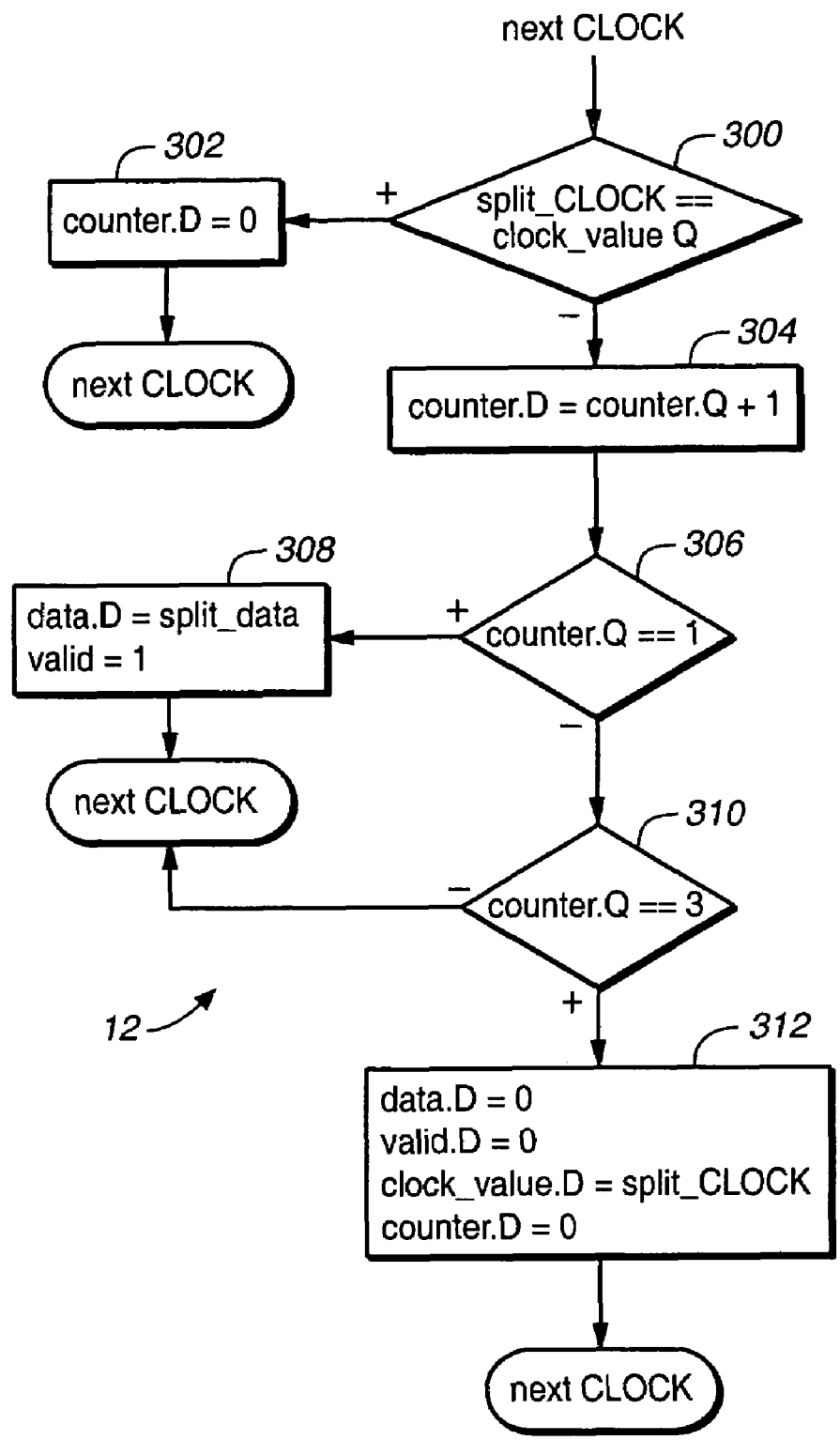
FIG._3

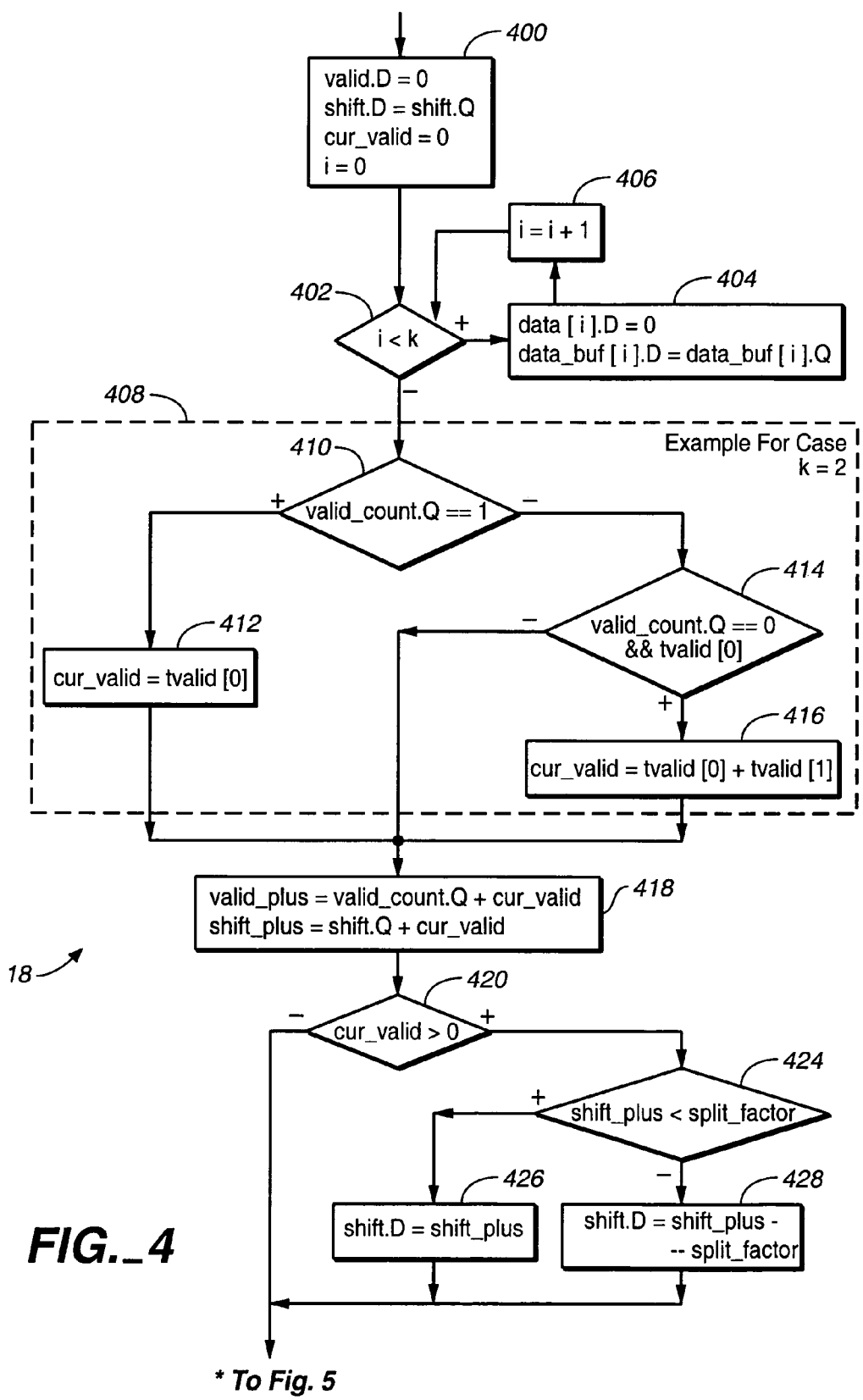
FIG._4

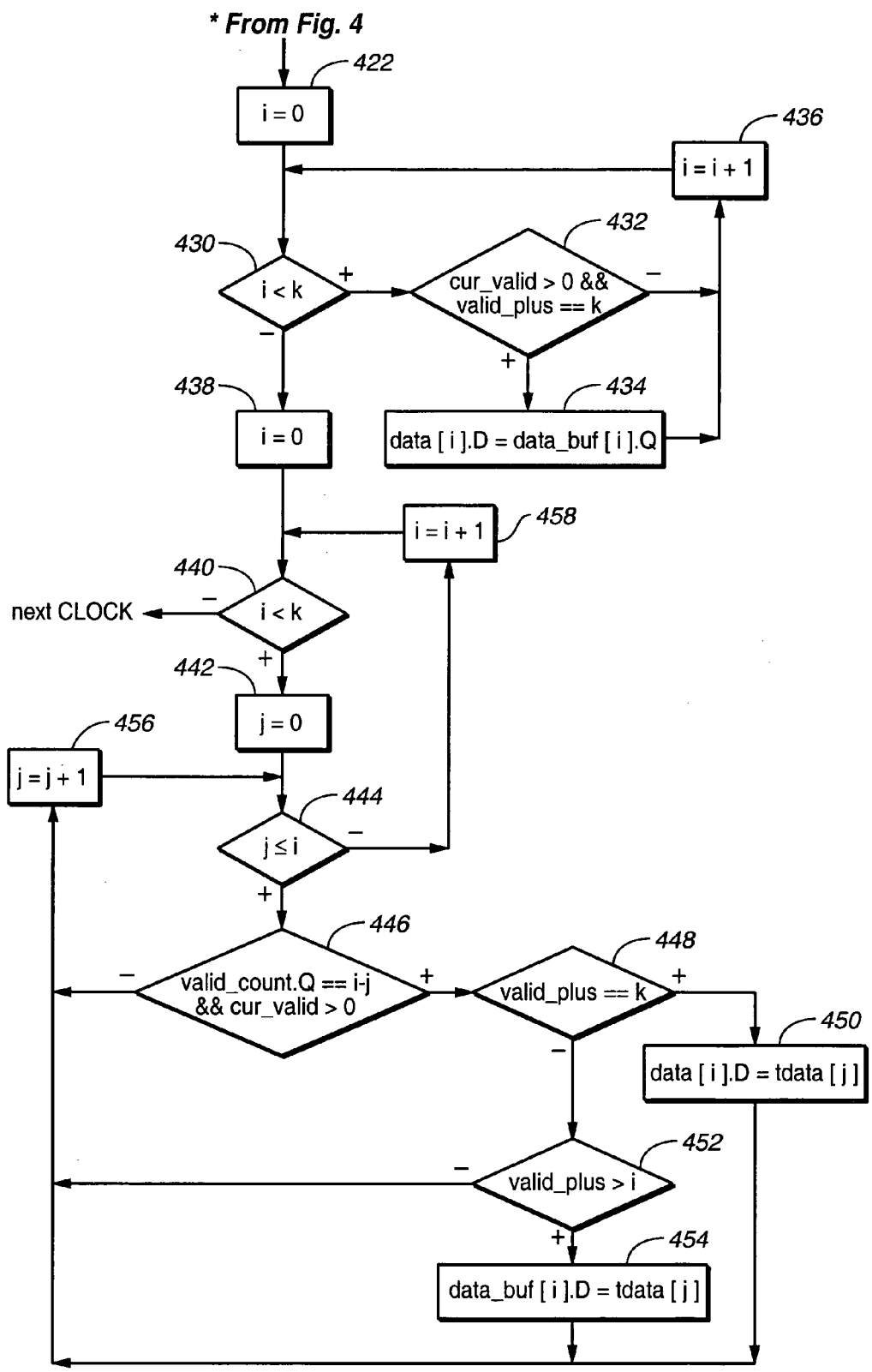
FIG._5

DATA STREAM FREQUENCY REDUCTION AND/OR PHASE SHIFT

FIELD OF THE INVENTION

This invention relates to signal conversion, and particularly to conversion of signals for frequency reduction and/or phase shifting.

BACKGROUND OF THE INVENTION

Digital circuits operate on bit signals having high and low states, often represented by "1"s and "0"s. The bit rate is referred to as the bit frequency, or data frequency where the bits represent data. In integrated circuit chips, it is common that sequential circuits operate at different frequencies (different clock rates) such that inputs of a second circuit operating at one frequency receive outputs of a first circuit operating at a different frequency. Where the second circuit operates at a higher frequency than the first circuit, it is quite simple to convert low frequency data stream to a high frequency data stream by simply inserting additional 0's into the low frequency stream. However, a reversal of that conversion (i.e., to convert a high frequency data stream to a low frequency data stream) is not so easy.

Consider a circuit that operates at a given clock rate set by a clock signal, CLOCK, has data bus carrying data bits, DATA, and a port carrying valid bits, VALID, identifying whether a corresponding data bit on the data bus represents real data. The number of bits in VALID equals the number of clock cycles. The VALID bit is true, or "1", when the associated DATA bit on the data bus represents real data, and false, or "0", when the DATA bit is not real data. The density of a data stream containing DATA is the number of appearances of 1's in VALID during some time period, T, divided by the number of clock cycles for that period. Thus the density is a number having a maximum value of 1.0 representing a maximal density when VALID=1 on each clock cycle. Where the time period T is fixed, the density may be expressed simply as the number, DENS, of appearances of 1's in the VALID signal during period T. Dividing DENS by the number of clock cycles during period T results in the actual density. For example, if there are 256 clock cycles in time period T and 205 of the VALID bits are 1's, the density may be expressed as DENS=205, which is a density of $205/256$=0.8008.

Considering the case of converting a high frequency data stream to a low frequency data stream, if the density of the high frequency data stream is low enough, the conversion might be accomplished by data compression, namely eliminating DATA bits from the high frequency data stream having associated VALID=0 bits. For example, if a high frequency data stream contains 10 DATA bits, 0110010011, over a given period T, and the associated VALID bit stream is 1110111011, DENS=8, and the density of the bit stream is 0.8. At high frequency $f_{HIGH}$, T=10/$f_{HIGH}$. This high frequency data stream might be converted to a low frequency data stream by compressing the data to remove invalid data bits, forming the low frequency data stream containing as few as 8 data bits, 01101011 having an associated VALID bit stream, 11111111. However, this type of conversion is possible only if the density of the resulting low frequency data stream does not exceed 1.0, i.e., DENS≦8, meaning that $f_{LOW}$ must be at least as great as $0.8f_{HIGH}$ ($f_{LOW}$≧$0.8f_{HIGH}$). If $f_{LOW}$<$0.8f_{HIGH}$ in the example, frequency conversion by data compression cannot be accomplished. Instead, it is common to employ a de-serialization technique to split the high frequency data stream into a plurality of low frequency data streams which are then applied to the output circuit.

Even if two signals have the same frequency, they may phase-shifted from each other, particularly if they employ different clock generators. In such a case, there is a need to synchronize data streams.

The present invention is directed to converter circuit that can convert a high frequency data stream to a low frequency data stream and can correct for phase shift between data streams.

SUMMARY OF THE INVENTION

In accordance with an embodiment of the present invention, a frequency reduction or phase shifting circuit has an input receiving an input data stream having an input frequency and a representation of desired output frequency. A splitter splits the input data stream into a plurality of split signals each at a frequency of the desired output frequency. A plurality of catchers identify valid bits of each respective split signal. A shifter shifts valid bits identified by at least some of the catchers by a predetermined number. An output provide an output data stream at the desired output frequency.

One selected predetermined number operates the circuit as a phase shifter; other predetermined numbers identify a de-serialization level for frequency reduction.

In some embodiments, the splitter also receives a stream of validity bits identifying which bits of the data stream are valid data. The splitter also provides validity bits to the catchers to allow the catchers to identify valid data to the shifter. The splitter operates on a split factor that is empirically derived based on the input and output frequencies and density of valid data bits in the input data stream.

In other embodiments, a process of frequency reduction and/or phase shifting for data streams is provided. In yet other embodiments, a computer program code is provides to cause a computer or processor to perform frequency reduction and/or phase shifting on a data stream.

BRIEF DESCRIPTION OF THE DRAWINGS

FIG. 1 is a block diagram of a signal conversion circuit according to a presently preferred embodiment of the present invention.

FIG. 2 is a functional block diagram of a splitter used in the circuit of FIG. 1.

FIG. 3 is a functional block diagram of a catcher used in the circuit of FIG. 1.

FIGS. 4 and 5, taken together, is a functional block diagram of a terminal device used in the circuit of FIG. 1.

DETAILED DESCRIPTION OF THE PREFERRED EMBODIMENTS

Consider the case of a first stream at a high frequency, $f_{HIGH}$, having a density so high that the first stream cannot be converted to a lower frequency, $f_{LOW}$, by data compression without exceeding an established maximal density of DATA bits in a data stream. A circuit according to the present invention de-serializes the $f_{HIGH}$ input stream to a k-wide stream that will operate at the second clock frequency, $f_{LOW}$, where k≧1. Thus the present invention provides a circuit architecture which reduces the high frequency data stream to a low frequency stream and de-serializes the input stream to a k-wide stream. In the case where k=1, the circuit de-serializes an input data stream to one having a selected phase shift. Thus the present invention also provides circuit architecture which shifts the phase of an input data stream to synchronize the data stream to a output clock.

In the example where the VALID bit stream associated with the high frequency data stream is 1110111011, the data can be considered arranged in data packets, with each packet being identified by the number of consecutive 1's in the VALID bit stream. Hence in the example, the high frequency data stream is arranged in packets of 3, 3 and 2 bits, respectively, whereas the low frequency data stream is arranged in a single packet of 8 bits.

Consider a circuit operating at an input clock rate, inp_CLOCK, having an input data bus receiving a bit stream, inp_DATA, and an input port receiving inp_VALID bits. Inp_VALID is true, or "1", when real data appears on inp_DATA. The density of the real data, inp_DENS, is the average number of appearance of 1's on inp_VALID during some number of input clock cycles, which for example may be 256 input clock cycles (although any number of clock cycles may be employed for defining inp_DENS). The data stream may be uniform or not. The length of a data packet (the number of consecutive 1's in inp_VALID) is denoted by burst_depth. The frequency of inp_CLOCK is denoted by inp_frq and the frequency of out_CLOCK is denoted by out_frq.

FIG. 1 is a block diagram of circuit architecture for converting a data stream at an input clock signal frequency, inp_CLOCK, to an output clock signal frequency, out_CLOCK. The circuit includes a splitter 10 that receives inp_CLOCK, as well as the inp_VALID and inp_DATA streams. Splitter 10 splits the input clock stream, inp_CLOCK, into n split_CLOCK streams and splits the input data stream, inp_DATA, into n split_DATA streams, for respective ones of n catchers 12. The term n is a split_factor that is empirically derived for the specific circuit. For example, one a suitable calculation for split_factor for the 256 input clock cycles might be a rounding up to the nearest integer of:

$$\text{split\_factor} = 3.0 * \left(\frac{\text{inp\_frq}}{\text{out\_frq}}\right) * \left(\frac{\text{inp\_DENS}}{256}\right) + 1 + \text{burst\_depth}.$$

Split_factor $n \geq 2$, because burst_depth $\geq 1$.

Catchers 12 synchronize the plural split_CLOCK streams from splitter 10 to the output clock frequency of out_CLOCK, which is the output clock frequency. The n data bits from splitter 10 are supplied by respective catchers 12 to shifter 14 at the clock rate of out_CLOCK. The n valid bits from catchers 12 are also supplied to shifter 16. Shifters 14 and 16 cyclically shift indices of the respective streams based on a de-serialization factor k. The shifted streams are accumulated by k-terminal 20 to derive the output valid stream and k-wide data streams.

The logic of splitter 10 is shown in greater detail in FIG. 2. Splitter 10 includes an input bus that receives the inp_DATA stream, an input port that receives the inp_VALID stream and output registers that provide split_DATA[i] and split_CLOCK[i] output streams, where $0 \leq i < n$. For ease of explanation of the logic illustrated in FIG. 2, splitter 10 also includes n auxiliary registers circle[i]. The term next_circle [i] identifies the output nets for each index i. Although splitter 10 is herein described as employing physical output and auxiliary registers, the function described in association with FIG. 2 may be performed by a processor operating under the control of suitable program code, without regard to the physical attributes of the processor.

Upon receipt of the a first (i=0) inp_CLOCK bit, the n circle[i] registers are initialized to logical 0: circle[0]=0, circle[1]=0, . . . , circle[n−1]=0. Upon receipt of the a the next (i=1) inp_CLOCK bit, the net for index 0 is set to the negation of register circle[n−1] and the net for index 1 is set to the negation of register circle[0]:

$$\text{next\_circle}[0] = \neg \text{circle}[n-1]$$

$$\text{next\_circle}[1] = \neg \text{circle}[0],$$

where $\neg$ denotes a negation. In the example, next_circle[0]= 1 and next_circle[1]=1. Additionally, values of enable bits en[0] and en[1] are logically derived as $$\text{en}[0] = (\neg \text{circle}[0].Q) \text{ AND inp\_VALID}$$

$$\text{en}[1] = (\text{circle}[1].Q) \text{ AND inp\_VALID},$$

where .Q identifies the output of the respective register. In the example,
en[0]=1, if inp_VALID=1,
en[0]=0, if inp_VALID=0,
en[1]=0, if inp_VALID=1,
en[1]=1, if inp_VALID=0.

At step 202, the value of i is set to 2, and at step 204 the value of i is compared to the value of the split_factor (n). If i is smaller than the split_factor, such as if $n \geq 3$, then at step 206, the net of index i is set to the output of the circle[i] register, $$\text{next\_circle}[i] = \text{circle}[i].Q,$$

and the value of enable bit en[i] is logically derived as $$\text{en}[i] = \text{circle}[i].Q \text{ AND inp\_VALID}$$

In the example, if $n \geq 3$,
en[2]=1, if inp_VALID=0,
en[2]=0, if inp_VALID=1,
etc.

The value of i is then incremented at step 208 (i=i+1) and the process returns to step 204. Thus, the loop formed by steps 204-208 generate values for the nets of successive indices i and successive bit values for enable bits en[i] for each value of i=3, 4, . . . , (n−1), where $n \geq 3$.

If at step 204 the value of i is not smaller than the split_factor, then the value of i is reset to 0 at step 210. At step 212, if the value of i is smaller than the split_factor, such as if i≠n, then at step 214 the value of the split_CLOCK [i] input bit to is logically derived as the EXCLUSIVE-OR of the output from the split_CLOCK[i] register and enable bit en[i].

$$\text{split\_CLOCK}[i].D = \text{split\_CLOCK}[i].Q \hat{\ } \text{en}[i],$$

where $\hat{\ }$ is EXCLUSIVE-OR, and .D is the register input. For example, since split_CLOCK[O] register was initialized to 0, a "1" is supplied to the input of the split_CLOCK[0] register if inp_VALID is "1"; otherwise, a "0" is supplied to the split_CLOCK[0] register.

The value of the split_DATA[i] input bit is logically derived as either the negation of enable bit en[i] anded with the output from the split_DATA[i] register, or the enable bit en[i] anded with the inp_DATA bit.

$$\text{split\_DATA}[i].D = \{(\neg \text{en}[i]) \text{ AND split\_DATA}[i].Q\}$$
$$\text{OR } \{\text{en}[i] \text{ AND inp\_DATA}\}.$$

In the example, the split_DATA[0] bit will take the value of the inp_DATA[0] bit if inp_VALID=1 or will take the value 0 otherwise.

Additionally, the input to the circle[i] register is logically derived as either the negation of the inp_VALID bit anded with the output of the circle[i] register, or the inp_VALID bit anded with the value of the net of index i.

circle[i].D={(¬inp_VALID) AND circle[i].Q} OR {inp_VALID AND next_circle[i]}.

In the example, for i=0 the output of the circle[0] register will be 1 if inp_VALID=1, or 0 otherwise.

At step 216 the value of i is incremented by 1 and the process loops back to step 212 to consider the next value of i. If at step 212 the value of i is not smaller than split_factor n, such as if i=n, the process continues to the next inp_CLOCK cycle.

Consider the example of split-factor=n=2, and a data stream sequence of a0, a1, a2, a3, a4, a5, . . . . Assume also that bit a2 is not valid data, so the inp_VALID stream is 1, 1, 0, 1, 1, 1, . . . . Since n=2, there are only two split_DATA stream outputs, split_DATA[0] and split_DATA[1], and two split clocks, split_CLOCK[0] and split_CLOCK[1]. Since i=2 from step 202, i is not smaller than n at step 204, so the process omits the loop formed by steps 206 and 208. At step 218, the value of en[0] is 1 (because inp_VALID=1), and the value of split_DATA[0] is the value of inp_DATA[0]=a0. The value of split_CLOCK[0] is 1. At the next input clock, i is incremented at step 216 (i.e., to i=1). At step 214, inp_VALID=1, so split_DATA[1]=a1 and split_CLOCK[1]= 1. At the next input clock (i=2) with inp_VALID=0, split_DATA[0]=0 and split_CLOCK[0]=0. The process continues through the input data stream so that split_DATA[0]= a0, 0, a4, . . . and split_DATA[1]=a1, a3, a5 . . . , split_CLOCK[0]=1, 0, 1, . . . and split_CLOCK[1]=1, 1, 1, . . . .

Where n is some greater number, such as n=3, there are n split_DATA streams and split_CLOCK streams derived in the same manner, and the states of the auxiliary registers and enable bits are established by the loop of steps 204, 206 and 208. Thus, where n=3 and for the example given where data bit a2 is not valid, split_DATA[0]=a0, a3, . . . , split_DATA [1]=a1, a4, . . . and split_DATA[2]=0, a5, . . . , and split_CLOCK[0]=1, 1, . . . , split_CLOCK[1]=1, 1, . . . and split_CLOCK[2]=0, 1, . . . .

FIG. 3 is a logical flow diagram of a catcher 12 that synchronizes the input data stream at a clock rate split_CLOCK[i] to clock rate out_CLOCK. Input to each catcher 12 are out_CLOCK and the respective split_DATA[i] and split_CLOCK[i]. Each catcher 12 includes a clock_value auxiliary register and a counter, as well as a split_DATA output register and a catched_valid output. To synchronize the input data stream to out_CLOCK, a value corresponding the out_CLOCK clock rate is input to the clock_value register. Upon receipt of the next out_CLOCK signal, if the split_CLOCK rate is equal to the output of the clock_value register at step 300, the counter is set to 0 at step 302, and the split_CLOCK rate is established by the out_CLOCK rate in the clock_value register.

If at step 300 the split_CLOCK rate is not equal to the out_CLOCK rate set in the clock_value register, the count in the counter is incremented at step 304. At step 306, if the count in the counter is equal to 1, then at step 308 split_DATA is input to the split_DATA register, and the catched_valid bit is set to true or 1. Thus, the split_DATA register contains valid data.

If at step 306 the count in the counter is not 1, then at step 310 the decision is made as to whether the count in the counter is 3. If the count is not 3 (i.e., it is 2) the process outputs catched_DATA in the form of the split_DATA in the split_DATA register in synchronous with the value established by the clock_value register, and the next out_CLOCK signal increments the count in the counter at step 306. With the count in the counter incremented to 3, at step 312 the catched_DATA register and counter are reset to 0, the valid bit is set to 0 and the split_CLOCK rate is input to the clock_value register. At the next out_CLOCK signal, the counter is incremented to 1 and the process continues.

Each shifter 14 and 16 simply shifts the indices based on a value of SHIFT from terminal 18. More particularly, shifter 14 receives the catched_DATA from each of the n catchers 12 to reassemble a data stream having n bits shifted_DATA[0], . . . , shifted_DATA[n−1]. The output of shifter 14 is a shifted data stream of k valid data bits to terminal 18. Similarly, shifter 16 receives the catched_VALID bits from catchers 12 in the form shifted_VALID[0], . . . , shifted_VALID[n−1], and supplies a shifted stream of k valid bits to terminal 18.

Each shifter 14, 16 cyclically (based on the shift_factor n) shifts indices of the input array, A[i] to the output array Z[i] based on the value of SHIFT.

Z[i]=A[i+SHIFT % split_factor], where 0≦i<split_factor. The number of multiplexers in each shifter 14, 16 is depth*split_factor*width, where depth is number of digits for SHIFT and width is the width of the bus.

FIGS. 4 and 5, taken together, are a logical flow diagram of terminal 18. Terminal 18 accumulates k valid bits and then recalculates a new SHIFT (value k) for shifters 14 and 16. Terminal 18 has k outputs, which are outputs of k consistent catchers 12. Thus for shift=0, terminal 18 provides outputs of first k catchers, for shift=k the circuit's outputs are outputs of next k catchers and so on. Hence, the output is a k-wide data stream at out_CLOCK frequency Terminal circuit 18 assigns the first k outputs of the n data outputs from data shifter 14, and adds value k to the shift. Thus for shift=0 the circuit's outputs are outputs of first k catchers 12, for shift=k the terminal circuit outputs are outputs of next k catchers and so on. Terminal 18 has k inputs tvalid[0], . . . , tvalid[k−1] (first k outputs of valid shifter 16), k input data buses tdata[0], . . . , tdata[k−1] (first k outputs of data shifter 14), valid_count register, k data output registers and a SHIFT output register. Terminal 18 also has k auxiliary registers data_buf and a cur_valid register.

At step 400, the contents of the valid_count register and cur_valid register are initialized to 0, i is set to 0, and the input to the SHIFT register is set equal to its output. If, at step 402, i<k, the DATA[i] output register is set to 0 and the input to data_buf[i] register is set to its output at step 404, and i is incremented by 1 at step 406. The loop formed by steps 402-406 is repeated until i is not smaller than k (i.e., i=k).

Consider the case where k=2 for block 408 in FIG. 4. If at step 410 the valid_count register is 1, then the cur_valid register is set to tvalid[0] at step 412 and the process continues to step 418. If at step 410 the valid_count register is not contain 1, then at step 414 if valid_count register contains 0 and if tvalid[1] is not equal to 0, then the cur_valid register is set to a sum of tvalid[0] and tvalid[1] at step 416, and the process continues to step 418. If at step 414 valid_count is not 0 (i.e., is 2) or if tvalid[1]! is 0, the process continues to step 418. Thus, for k=2, block 408 provides an output of cur_valid=0 if either valid_count ≠0 or if tvalid [0]=0 (step 414), a cur_value equal to tvalid[0] if valid_count=1 (step 412), or a cur_valid=tvalid[1]+1 if valid_count=0 and tvalid[0]!=0 (where any tvalid[i] is one bit, tvalid[1]=1) (steps 414 and 416). Hence, for k=2 and tvalid [i] being one bit, cur_valid may be either 0, 1 or 2.

At step 418 the value of cur_valid from block 408 is added to valid_count and to SHIFT to derive a value_plus value and a shift_plus value, respectively. If at step 420 cur_value is not greater than 0 (i.e., cur_value equals 0), the process continues to step 422 (FIG. 5). If at step 420 cur_value is greater than 0, then if shift_plus is smaller than split_factor at step 424, the value of SHIFT is set to shift_plus at step 426. Otherwise, if shift_plus is not greater than split_factor, the value of SHIFT is set to shift_plus minus shift_factor at step 428.

The result of the loops of steps 420, 424, 426 and 428 is setting of a value of SHIFT as the value initially established at step 400 (if cur_value=0), the value of shift_Plus (if cur_value>0 and shift_plus<split_factor) or the value of shift_plus plus split_factor (if cur_value>0 and shift_plus≧split_factor). The value of SHIFT is supplied by terminal 18 to shifters 14 and 16 (FIG. 1) as k.

Continuing the process of termination circuit 18 at FIG. 5, at step 422 i is set to 0 and a loop formed of steps 430, 432, 434 and 436 is followed to set the output data register DATA[i] for each index i until i=k. More particularly, at step 430, if i is smaller than k, then at step 432 if cur_valid is greater than 0 and if valid_plus equals k, the content of the data_buf register is input to the applicable DATA[i] register at step 434, and the value of i is incremented at step 436. On the other hand, if at step 432 cur_valid is not greater than 0 (i.e., cur_valid=0) and/or if valid_plus does not equal k (valid_plus≠k), the process steps directly to step 436.

When i is incremented to the value of k as identified at step 430, then at step 438, i is again set to 0 for another loop formed of steps 440-458. More particularly, at step 440, if i is not smaller than k (i.e., if i≧k), then the process steps to the next out_CLOCK. If i is smaller than k, then at step 442 an index j is set to 0. If at step 444, j is smaller than or equal to i (not greater than i), a decision step 446 identifies if the output of the valid_count register is equal to i−j and if cur_value>0. If the condition at step 446 is true, then if at step 448 valid_plus is equal to k, the value of tdata[j] is input to data register DATA[i] at step 450, where tdata[j]∈DATA [i], and j≦i. On the other hand, if the condition at step 446 is true and if at step 448 valid_plus is not equal to k, then if at step 452 valid_plus>i, data_buf[i] is loaded with tdata[j] at step 454.

If the condition at step 446 is false, or upon establishing a value for DATA[i] at step 450 or a value for data_buf[i] at step 454, or if valid_plus is not greater than i (e.g., valid_plus≦i), index j is incremented at step 456 and the process returns to step 444 to determine if j≦i. If through the loop formed by steps 446-454 index j is incremented at step 456 so that j>i, then the process loops to increment i at step 458 and return to step 440.

Consider the case of k=2. Steps 440-458 perform the following functions: In a first stage when valid_count.Q=0, three conditions can occur:

1. If both inputs tvalid[0] and tvalid[1] equal 1, cur_valid=2 and both inputs are coupled to the outputs (DATA[0]=tdata[0] and DATA[1]=tdata[1]), and the process of the first stage is repeated.
2. If tvalid[0]=1 and tvalid[1]=0, cur_valid=1 and tdata[0] is stored (data_buf[0]=tdata[0]), and the process goes to the second stage (valid_count=1).
3. If tvalid[0]=0, the process simply stays in the present stage.

In a second stage when valid_count.Q=1, cur_valid=tvalid[0], and the states of tvalid[0] and tdata[0] are considered:

1. If tvalid[0]=1, (cur_valid=1), input data tdata[0] is output DATA[1] (DATA[1]=tdata[0]) and the process advances to the first (or next) stage.
2. If tvalid[0]=0 (cur_valid=0), the process remains in the present stage.

Hence, when in a given stage M, M real values are accumulated on data_buf, and when k values are accumulated, they are output. In the process of steps 440-458, as long as j is not greater than i (in which case i is incremented to be greater than j) index j is either i or i−1. Consequently, for a current stage for index i, tdata[j] is either DATA[i] or DATA[i−1]. If tdata[j] is DATA[i−1], it had been stored as buf_data[i] in the prior stage.

It will be appreciated, that additional stages are necessary for other values of k. Thus, in the description given for the second stage, if tvalid[0]=1 and DATA[1]=tdata[0], for k>2 the process advances to the next stage, rather than to the first stage.

The present invention thus provides a circuit for converting high frequency data streams to low frequency and for phase matching a data stream to a clock of a sequential circuit. The circuit comprises a SPLITTER circuit that splits the incoming data stream into a plurality of n split data streams at the output phase and frequency, n CATCHER circuits, two SHIFTER circuits, one for data and one for valid bits, and one k_TERMINAL circuit. The splitter operates on a split_factor, n, which is empirically derived for the specific circuit. The de-serialization level, k, identifies the width of the output stream. The circuit is particularly advantageous in that it can handle phase shifting without frequency conversion by setting k=1.

The invention also provides a process of frequency reduction and/or phase shifting of a data stream. In one embodiment, the invention is carried out in a computer or processor operating under control of a computer readable program containing code that is stored on a computer readable medium, such as a recording disc, to cause the computer or processor to carry out frequency reduction and/or phase shift of a data stream.

Although the present invention has been described with reference to preferred embodiments, workers skilled in the art will recognize that changes may be made in form and detail without departing from the spirit and scope of the invention.

What is claimed is:

1. A circuit having:
    an input for receiving an input signal containing a plurality of bits at an input frequency and for receiving a representation of desired output frequency;
    a splitter, which splits the input signal into a plurality of split signals each at a frequency of the desired output frequency;
    a plurality of catchers, wherein each catcher provides bits of a respective split signal and a valid signal identifying bits of the respective split signal that are valid;
    a first shifter, which shifts valid bits of the respective split signal that are identified by at least some of the catchers by a predetermined number, and a second shifter, which shifts the valid signal identified by at least some of the catchers by the predetermined number; and an output responsive to the shifted valid bits to provide an output signal containing a plurality of valid bits of the input signal at the desired output frequency.

2. The circuit of claim 1, wherein the output is further responsive to the shifted valid bits to derive the predetermined number.

3. The circuit of claim 1 operating as a phase shifter, wherein the predetermined number is 1.

4. The circuit of claim 1 operating as a frequency reducer, wherein the predetermined number is greater than 1 and identifies a width of the output signal.

5. The circuit of claim 1, wherein the number of split signals and the number of catchers are based on an empirically-derived split factor.

6. The circuit of claim 5, wherein the split factor is based on the input frequency and the desired output frequency.

7. A computer useable medium having a computer readable program embodied therein for addressing data to convert a high frequency data stream to a low frequency data stream at a desired output frequency, the computer readable program comprising:

first computer readable program code for causing the computer to split the high frequency data stream into a plurality of split signals each at a frequency of the desired output frequency;

second computer readable program code for causing the computer to provide bits of a respective split signal and a valid signal identifying bits of the respective split signal that are valid;

third computer readable program code for causing the computer to shift identified valid bits of the respective split signal by a predetermined number;

fourth computer readable program code for causing the computer to shift the valid signal by the predetermined number; and fifth computer readable program code for causing the computer to output an output data stream containing a plurality of shifted valid bits of the input signal at the desired output frequency.

8. The computer useable medium of claim 7, wherein the fifth computer readable program code is further responsive to the shifted valid bits to derive the predetermined number.

9. The computer useable medium of claim 7, wherein the number of split signals is based on an empirically-derived split factor.

10. The computer useable medium of claim 9, wherein the split factor is based on the input frequency and the desired output frequency.

11. A process of converting a phase or frequency of an input data stream to desired output phase or frequency comprising:

splitting the input data stream into a plurality of split signals each at a frequency of the desired output frequency;

providing a valid signal identifying bits of the respective split signal that are valid;

shifting valid bits of the respective split signal by a predetermined number, and shifting the valid signal by the predetermined number; and outputting an output data stream containing a plurality of the shifted valid bits of the input signal at the desired output frequency.

12. The process claim 11, further including deriving the predetermined number from the shifted valid bits.

13. The process of claim 11, wherein the number of split signals is based on an empirically-derived split factor.

14. The process of claim 13, wherein the split factor is based on the input frequency and the desired output frequency.

15. The process of claim 11, further including selecting a predetermined number to selectively reduce the frequency of the input data stream to an output data stream having a width based on the predetermined number or to shift a phase of the input data stream to the output data stream.

\* \* \* \* \*